US006212369B1

(12) United States Patent
Avasarala

(10) Patent No.: US 6,212,369 B1
(45) Date of Patent: Apr. 3, 2001

(54) MERGED VARIABLE GAIN MIXERS

(75) Inventor: Madhu Avasarala, San Jose, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 09/092,808

(22) Filed: Jun. 5, 1998

(51) Int. Cl.[7] .................................................. H04Q 7/32
(52) U.S. Cl. .................... 455/333; 455/323; 455/326; 455/209; 455/253.2; 455/315; 455/293; 327/560; 327/356; 327/359; 327/346
(58) Field of Search ................................. 455/333, 323, 455/326, 209, 253.2, 293, 315, 550, 403; 327/256, 356, 359, 358, 355, 560, 346

(56) References Cited

U.S. PATENT DOCUMENTS

| | | | |
|---|---|---|---|
| 5,379,457 | 1/1995 | Nguyen | 455/323 |
| 5,589,791 | 12/1996 | Gilbert | 327/359 |
| 5,675,392 | 10/1997 | Nayebi et al. | 455/323 |
| 5,826,182 | 10/1998 | Gilbert | 455/323 |
| 5,867,778 | 2/1999 | Khoury et al. | 455/323 |
| 5,933,771 | * 8/1999 | Tiller et al. | 455/323 |

* cited by examiner

Primary Examiner—Fan Tsang
Assistant Examiner—Keith Ferguson
(74) Attorney, Agent, or Firm—Hickman Coleman & Hughes, LLP

(57) ABSTRACT

The present invention teaches parallel coupling what are herein termed a "switching stage" and a "steering stage," thereby arranging the mixer and variable gain amplifier circuitry as a single merged circuit. The merged variable gain mixers of the present invention provide mixing and gain functionality utilizing only that power needed for a basic mixer function and only the transconductance of the basic mixer function (thereby eliminating non-linearities introduced by additional transconductance stages of prior art circuitry). Further, in the merged variable gain mixers described herein, no additional headroom is needed other than what is required by the basic mixer function. The present invention contemplates a variety of merged variable gain mixers including AC and DC coupled merged variable gain mixer of both single and double balanced configuration.

23 Claims, 5 Drawing Sheets

MERGED VARIABLE GAIN MIXERS

DESCRIPTION

1. Technical Field

The present invention is related to signal mixing and amplifying or attenuating circuitry. More specifically, the present invention teaches a variety of merged variable gain mixers capable of mixing and variably amplifying or attenuating an input signal.

2. Background Art

Many electronics applications require processing an input frequency signal with both a mixing function and a variable gain function. For example, typical wireless communication system transmitters and receivers utilize separate mixer and variable gain amplifier devices in order to operate upon the input signal as desired. In many applications, such circuitry must operate with low supply voltages (e.g., 2.7 Volts) and at extremely low temperatures (e.g., −40 degrees C.).

FIG. 1 illustrates a prior art mixing and gain control circuitry 100 suitable for mixing and variably amplifying an input signal VIN to generate a desired output signal Vout. The circuitry 100 includes a so called Gilbert cell mixer 102, a variable gain amplifier 104, blocking capacitors $C_1$ and $C_2$, and a bias source formed by the resistor pair $R_1$ and $R_2$. The Gilbert cell mixer 102 includes three differentially connected transistor pairs Q1-Q2, Q3-Q4, and Q5-Q6, a current source I1, and a pair of resistors $R_3$ and $R_4$. Those skilled in the art will be familiar with the operation of the Gilbert cell mixer 102, the functionality of which is defined primarily by the linear transconductor 103 (formed by the transistor pair Q5-Q6) and the current switch or switching quad 105 (formed by the transistor quad Q1-Q4) which causes the mixing of the input current.

The input signal Vin is coupled to the bases of transistors Q5 and Q6 so that the linear transconductor 103 may convert it into a current signal. The local oscillator signal LO is connected to the bases of differential transistor pairs Q1-Q2 and Q3-Q4. The blocking capacitors $C_1$ and $C_2$ may serve to disassociate any DC bias present on the LO signal.

The mixer 102 operates as follows. The current signal out of the transconductor 103 is multiplied by +1 and −1 at the frequency of the local oscillator signal LO. This happens as the local oscillator signal LO switches the switching quad 105 ON and OFF at the frequency of the local oscillator signal LO. The resulting output current into the load (the load here being represented for convenience by $R_3$ and $R_4$) is a current which contains signals with frequencies that are the sum and difference, respectively, of the frequencies of the local oscillator signal LO and the input signal Vin. Typically only one of the sum and difference signals is later used, the other being eliminated by simple filtering (not shown in FIG. 1). Hence, as will be appreciated, the mixer 102 is basically a multiplier that takes a local oscillator signal LO and the input signal Vin and frequency translates the input signal Vin to a new differential signal at the mixer output terminals $M_1$ and $M_2$.

Depending upon the application, a variable gain function can either precede or follow the mixer function in a radio transceiver. In a transmit application the mixer would serve as an upconvertor. That is, the input would be either at baseband or intermediate frequency (IF), typically 0–20 MHz and 10–400 MHz, respectively. The output signal from the mixer would be at much higher RF frequencies. Typically, any variable gain function preceding the mixer is called IF variable gain and any variable gain function after the mixer is called RF variable gain.

In the prior art Gilbert cell mixers there are implementations of IF variable gain wherein the gain of the input transconductor can be varied by controlling the gain of the current source I1. However, in FIG. 1 we illustrate an RF variable gain control function (i.e., the gain function is implemented after the mixer). Accordingly, the differential signal generated by the mixer at terminals $M_1$ and $M_2$ is coupled to the input of the variable gain amplifier 104. As will be appreciated, the amplifier 104 shown in FIG. 1 is simply a conceptual representation of a voltage controlled variable gain amplifier. That is, as the control voltage $V_{gc}$ varies, the gain of the amplifier 104 varies.

Prior art FIG. 2 is a schematic showing in more detail one typical variable gain amplifier 104. The amplifier 104 of FIG. 2 includes three differentially connected transistor pairs Q7-Q8, Q9-Q10, and Q11-Q12, a pair of resistors $R_5$ and $R_6$, and a second current source 12. The mixer outputs $M_1$ and $M_2$ are coupled to the bases of transistors Q7 and Q8. The emitters of Q7 and Q8 are coupled at a first terminal of a second current source 12. Hence the voltage signal on $M_1$, and $M_2$ is once again converted into a current signal by another transconductance stage formed by the transistor pair Q7-Q8. Those of skill in the art will appreciate that a linear transconductance stage such as this may take on innumerable forms.

The control voltage $V_{gc}$ is coupled to the bases of transistor pairs Q9-Q10 and Q11-Q12. The emitters of Q9 and Q10 are coupled to the collector of transistor Q7. The emitters of Q11 and Q12 are coupled to the collector of transistor Q8. The collectors of transistors Q9 and Q12, and first terminals of the resistors $R_5$ and $R_6$ are coupled to the supply voltage $V_{cc}$. A second terminal of the resistor $R_5$ is coupled to the collector of transistor Q10 and a second terminal of the resistor $R_6$ is coupled to the collector of transistor Q11. The output signal $O_f$ is therefore generated at the collectors of Q10 and Q11.

Typical of the Prior Art, the mixing and gain circuitry 100 shown in FIGS. 1 and 2 has several shortcomings. One major shortcoming is the non-linearity introduced by the two transconductance stages (i.e., Q5-Q6 and Q7-Q8). Another serious shortcoming is the power loss due to the current sources I1 and I2. This power loss is particularly problematic when designing for supplies at 2.7V (and lower) and cold temperature operating conditions.

FIG. 3 illustrates a second mixing and gain control circuitry 200 of the Prior Art. The circuitry 200 is motivated by a recognition that the second transconductance stage formed by the transistor pair Q7 and Q8 is unnecessary if one connects the Gilbert cell mixer 102 directly in series with the transistor pairs Q9-Q10 and Q11-Q12. Doing so, as shown in FIG. 3, allows the gain control voltage signal $V_{gc}$ to directly control the current flow through the Gilbert cell mixer 102. This eliminates any non-linearities introduced by the second transconductance stage as well as improving power efficiency by eliminating the second current source I2.

The improvements in linearity and power efficiency of circuitry 200 are not free. Connecting the Gilbert cell mixer 102 in series with the variable gain amplifier of FIG. 3 forms a circuit that suffers from a four transistor voltage drop, specifically, the three transistor drop across the Gilbert cell mixer 102 and the single transistor drop across transistor pairs Q9-Q10 and Q11-Q12. This makes use of the circuitry 200 with low voltage supplies problematic.

What is needed is a mixer and variable gain amplifier circuit that lacks the non-linearity and power inefficiencies of multiple transconductance stages, yet is capable of operating properly when provided low supply voltages.

DISCLOSURE OF THE INVENTION

The present invention teaches parallel coupling what are herein termed a "switching stage" and a "steering stage," thereby arranging the mixer and variable gain amplifier circuitry as a single merged circuit. The merged variable gain mixers of the present invention provide mixing and gain functionality utilizing only that power needed for a basic mixer function and only the transconductance of the basic mixer function (thereby eliminating non-linearities introduced by additional transconductance stages of prior art circuitry). Further, in the merged variable gain mixers described herein, no additional headroom is needed other than what is required by the basic mixer function. The present invention contemplates a variety of merged variable gain mixers including AC and DC coupled merged variable gain mixer of both single and double balanced configuration.

For example, one embodiment of the present invention teaches a merged variable gain mixer having a switching device (or stage) and a current steering device (or stage) coupled in parallel. The switching device is responsive to an oscillator signal LO applied to a first input pair and an input signal $I_f$ applied to a second input pair to generate an output signal $O_f$ at an output pair. The output signal $O_f$ will have an amplitude that is a function of the input signal $I_f$ and an output frequency that is a function of both the signal LO and the input signal $I_f$. The current steering device is operable to control, as a function of a control voltage $V_{gc}$ applied at a control voltage input, a current flowing between a supply voltage $V_{cc}$ coupled to a supply voltage input and a current steering device first input pair. The switching device second input pair and the current steering device first input pair are coupled together such that the current steering device can attenuate the output signal $O_f$ by steering a portion of the current of the input signal $I_f$ away from the switching device and dumping that portion of the current out to the supply voltage $V_{cc}$.

The different stages may take on a variety of different arrangements. For example, in a double balanced merged variable gain mixer, the mixing stage may be formed as a mixing quad having four transistors and the steering stage may be formed as a steering quad with another four transistors. Alternatively, in a single balanced merged variable gain mixer, the mixing stage may be formed by a pair of transistors and the steering stage may be formed by another pair of transistors.

The present invention also teaches a method for mixing and variably amplifying an input signal $I_f$ in order to generate an output signal $O_f$. This method involves receiving an input signal $I_f$ having an input frequency and an input current, receiving a local oscillator signal, receiving a gain control voltage $V_{gc}$, absorbing a portion of the input current as a function of the gain control voltage $V_{gc}$ and the local oscillator signal, thereby generating an attenuated input signal having an attenuated input current, and generating an output signal $O_f$ that is a function of the attenuated input signal, the input frequency, and the local oscillator signal.

BRIEF DESCRIPTION OF THE DRAWINGS

Prior Art

Prior Art

Prior Art

BEST MODES FOR CARRYING OUT THE INVENTION

The present invention teaches parallel coupling what are herein termed a "switching stage" and a "current steering stage," thereby arranging the mixer and variable gain amplifier circuitry as a single merged circuit. The merged variable gain mixers of the present invention provide mixing and gain functionality utilizing only that power needed for a basic mixer function and only the transconductance of the basic mixer function (thereby eliminating non-linearities introduced by additional transconductance stages of prior art circuitry). Further, in the merged variable gain mixers described herein, no additional headroom is needed other than what is required by the basic mixer function. In essence, the present invention provides the variable gain function almost free: "almost" because due to a larger power required of the local oscillator signal LO, there is a slight increase in power consumption by the LO circuitry as compared to the basic mixer function taken alone.

Figure 4:
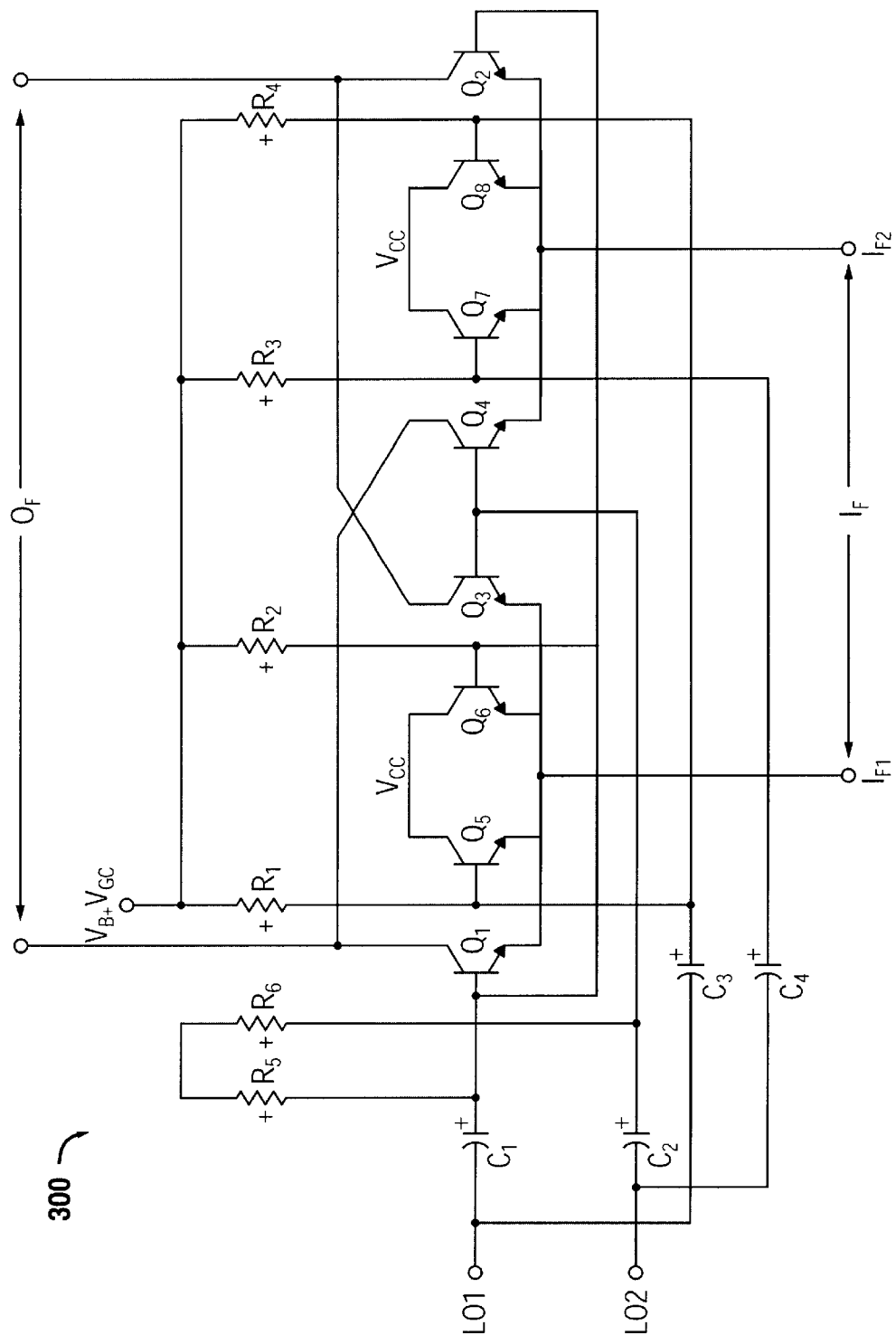
FIG. 4 is a schematic of an AC coupled, double balanced, merged variable gain mixer in accordance with one embodiment of the present invention.

FIG. 4 illustrates an AC coupled, double balanced, merged variable gain mixer 300 in accordance with one embodiment of the present invention. The merged variable gain mixer 300 of FIG. 4 includes a switching quad having four transistors Q1, Q2, Q3, and Q4, and a steering quad having four transistors Q5, Q6, Q7, and Q8. The bases of transistors Q1 and Q2 are coupled together and then connected to a first input LO1 for the local oscillator signal through a DC blocking capacitor $C_1$. The bases of transistors Q3 and Q4 are coupled together and then connected to a second input LO2 for the local oscillator signal through a DC blocking capacitor $C_2$. The emitters of transistors Q1, Q3, Q5, and Q6 are coupled together forming a first input IF1 for the differential input signal current $I_f$. The emitters of transistors Q2, Q4, 7, and Q8 are coupled together forming a second input for the input signal $I_f$.

The bases of transistors Q5 and Q8 are coupled together and then connected both to the first oscillator input LO1 through a DC blocking capacitor $C_3$, and to a control voltage $V_b+V_{gc}$ through resistors $R_1$ and $R_4$. The bases of transistors Q6 and Q7 are coupled together and then connected both to the second oscillator input LO2 through a DC blocking capacitor $C_4$, and to the control voltage $V_b+V_{gc}$ through resistors $R_2$ and $R_3$. As will be appreciated, LO1 and LO2 constitute the differential parts of the local oscillator signal LO. Bias current is provided to the bases of transistors Q1 and Q2 and the bases of transistors Q3 and Q4 through resistors $R_5$ and $R_6$, respectively.

The merged variable gain mixer 300 generally operates as follows. To achieve the maximum gain (i.e., minimum attenuation), the control voltage $V_{gc}$ is adjusted such that the steering quad transistors Q5-Q8 are turned off. When completely turned off, no current is dumped through these transistors, instead the entire current is steered into the output signal $O_f$. Note that in this state the merged variable gain mixer 300 operates as a regular mixer.

To attenuate the output signal $O_f$, the control voltage $V_{gc}$ is adjusted to create controlled offset between transistor pairs Q1-Q5, Q3-Q6, Q4-Q7, and Q2-Q8. The combination of DC offset and the AC coupling of the local oscillator signal LO causes the controlled offset to be dynamic. That is, the offset is maintained over the duration of the entire LO cycle. This dynamic effect causes a portion of the input current, during switching, to be diverted or steered away from the output switched current. This steered current is essentially thrown away, directly to a current supply for example. The amount of current steered away is dependent on the controlled offset.

In a typical radio transceiver, it is usually desirable to obtain a log-linear relationship between the output current and the control voltage. Those of skill in the art will be well familiar with such control circuits necessary to effect this relationship, and will recognize that the merged variable gain mixers of the present invention work well with such prior art control circuits.

In the merged variable gain mixer 300, the blocking capacitors $C_1$–$C_4$ serve to disassociate the switching quad from any DC present in the local oscillator circuitry. However, the local oscillator circuitry could also be designed to include a bias signal for driving the switching quad, thus eliminating the need to provide a bias signal through resistors $R_5$ and $R_6$. In this case, the blocking capacitors $C_1$–$C_4$ must be removed and the control offset voltage between the two quads introduced through separate local oscillator signals LO. One such suitable embodiment will now be described.

Figure 5:
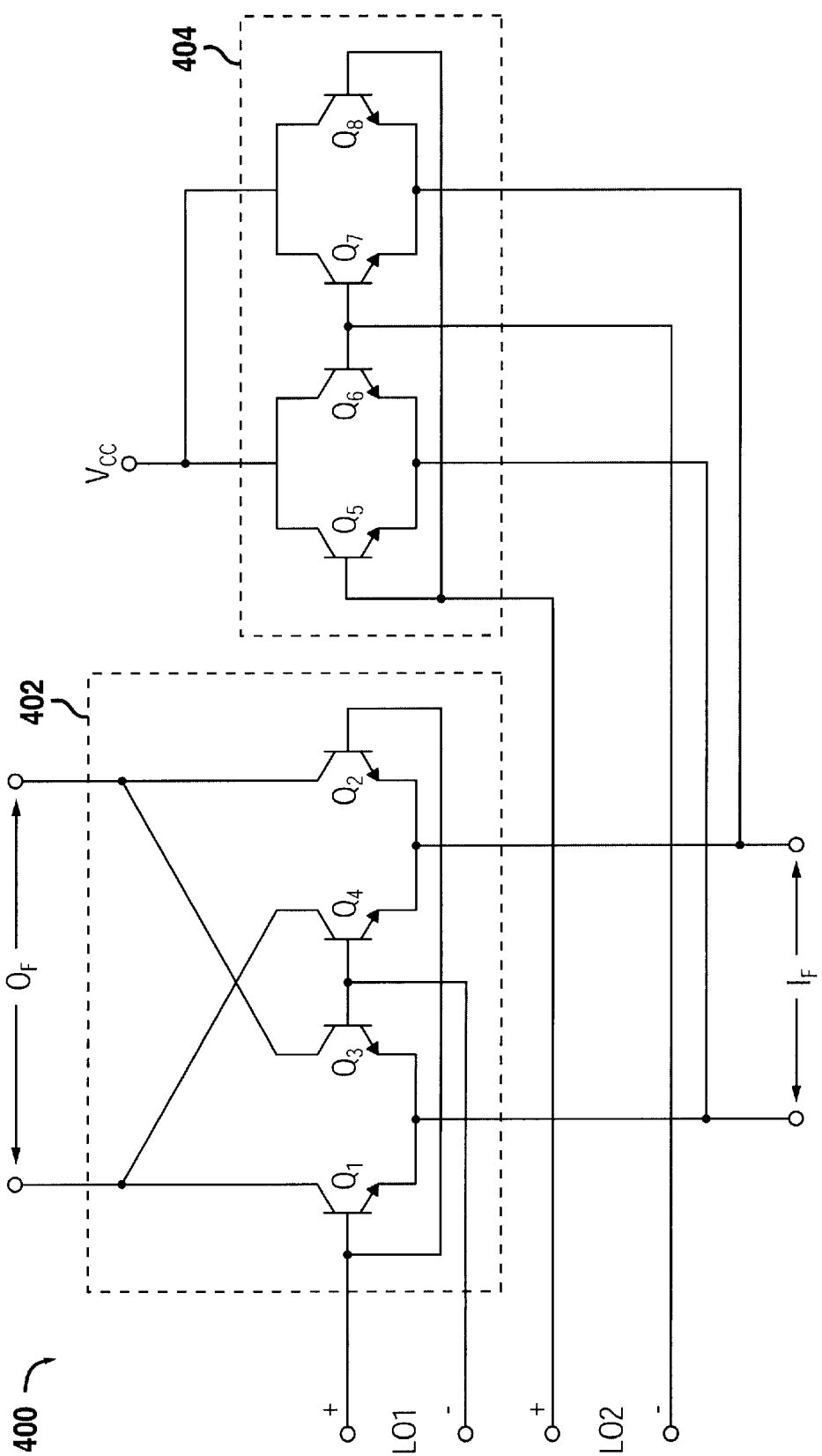
FIG. 5 is a schematic of a DC coupled, double balanced, merged variable gain mixer in accordance with another embodiment of the present invention.

FIG. 5 illustrates a DC coupled, double balanced, merged variable gain mixer 400 in accordance with another embodiment of the present invention. The merged variable gain mixer 400 is designed for use with local oscillator circuitry that is DC coupled. Accordingly, no blocking capacitors are required in the variable gain mixer 400 of FIG. 5. In all other respects, the merged variable gain mixer 400 is arranged and operates as the merged variable gain mixer 300 of FIG. 4.

The two LO waveforms LO1 and LO2 are substantially identical as far as AC characteristics are concerned. The average values are different, however, due to the offset introduced via control circuitry. This dynamic offset acts in exactly the same manner as described previously in steering current away during switching. The relationship between output current and input current follows the well known equation:

$$\frac{Iout}{Iin} = A \times \frac{1}{1 + \exp\left(\frac{Vcontrol}{Vt}\right)}$$

where A is a constant dependent upon the conversion gain of the mixer due to the LO switching, Vcontrol is the offset voltage between the main switching devices and the auxiliary steering devices and Vt is the thermal voltage given by the well-known relationship $$Vt = \frac{kT}{\sigma}.$$

When Vcontrol>4×Vt (about 100 mV @25 C), all current is carried by the switching devices and the steering devices are shut off at all points during the LO cycle. This is the point of maximum gain. At Vcontrol=Vt, the gain reduces to about one-half (½) the value of the maximum gain. Below Vt, the gain decreases substantially exponentially.

To further emphasize certain aspects of the present invention, FIG. 5 shows the merged variable gain mixer 400 with the switching quad drawn separately as a switching device 402 and the steering quad drawn separately as a current steering device 404. As will be apparent, the switching device 402 and the current steering device 404 are coupled in parallel. Hence the merged variable gain mixers of the present invention have no additional constraints in terms of extra supply voltage or current needed as compared to a stand alone mixer of the same or similar configuration (e.g., the switching transistors). Those skilled in the art will appreciate that the principles of the present invention can be used to couple any suitable current steering device together with any suitable switching device to form a merged variable gain mixer with the above-described improved characteristics.

Figure 6:
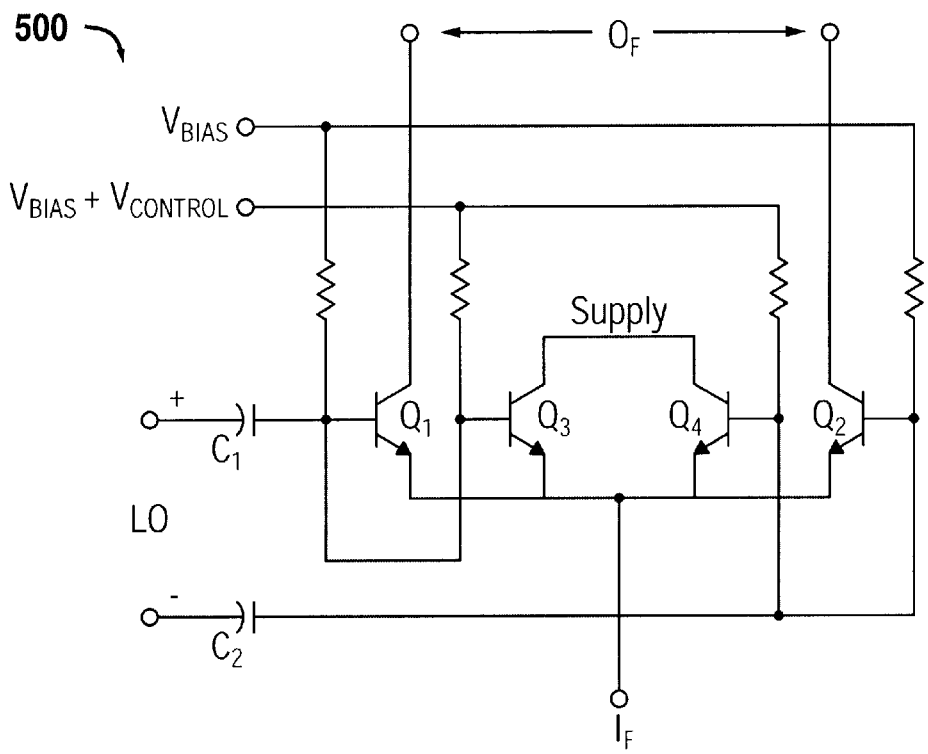
FIG. 6 is a schematic of an AC coupled, single balanced, merged variable gain mixer in accordance with yet another embodiment of the present invention.
Figure 7:
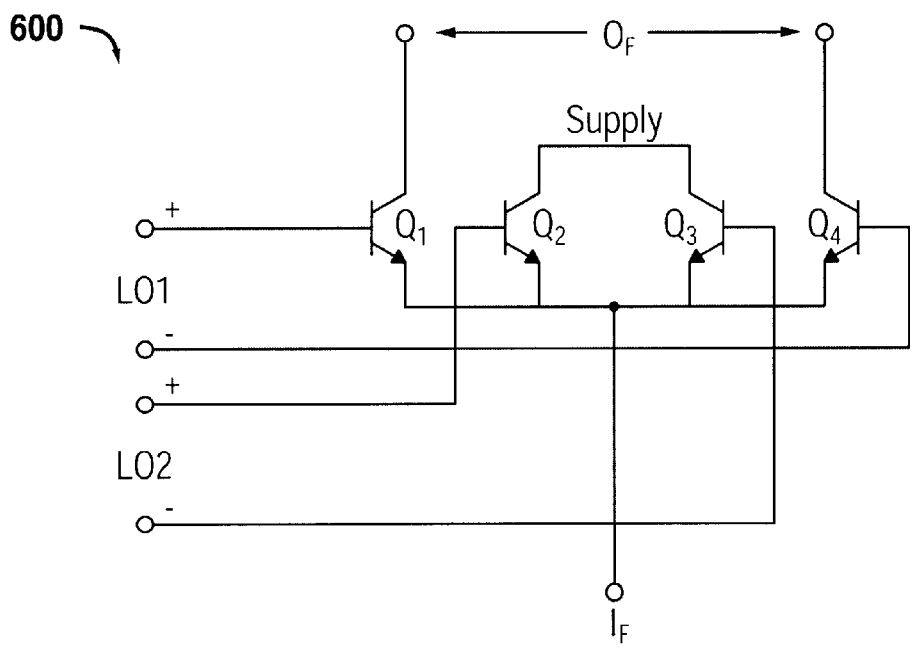
FIG. 7 is a schematic of a DC coupled, single balanced, merged variable gain mixer in accordance with a separate embodiment of the present invention.

The above description focused upon the merged variable gain mixer in a double balanced configuration. However, the present invention further contemplates single balanced merged variable gain mixers, both AC and DC coupled. FIG. 6 provides a schematic of an AC coupled, single balanced variable gain mixer 500, while FIG. 7 provides a schematic of a DC coupled, single balanced variable gain mixer 600.

Like the above described merged variable gain mixers, each variable gain mixer 500 and 600 has a switching stage coupled in parallel with a steering stage. However, in order to implement a single balanced merged variable gain mixer, note that only four transistors (as opposed to eight) are required. By referring to FIGS. 6 and 7, and by way of analogy with the above-description of the double balanced variable gain mixers, those of skill in the art will readily understand the operation and implementation of the single balanced variable gain mixers of the present invention.

Figure 1:
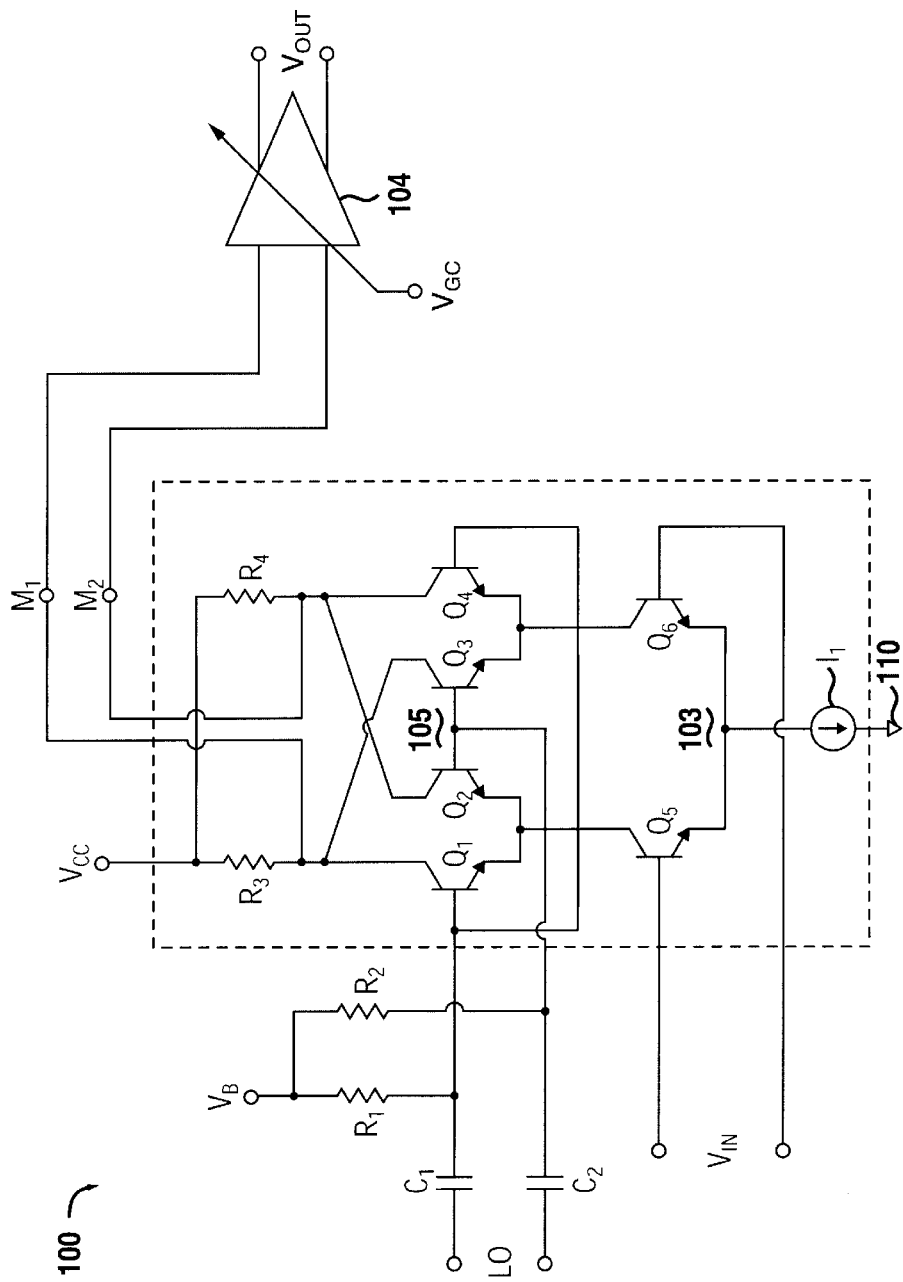
FIG. 1 is a schematic of one traditional mixer and variable gain amplifier circuitry.
Figure 3:
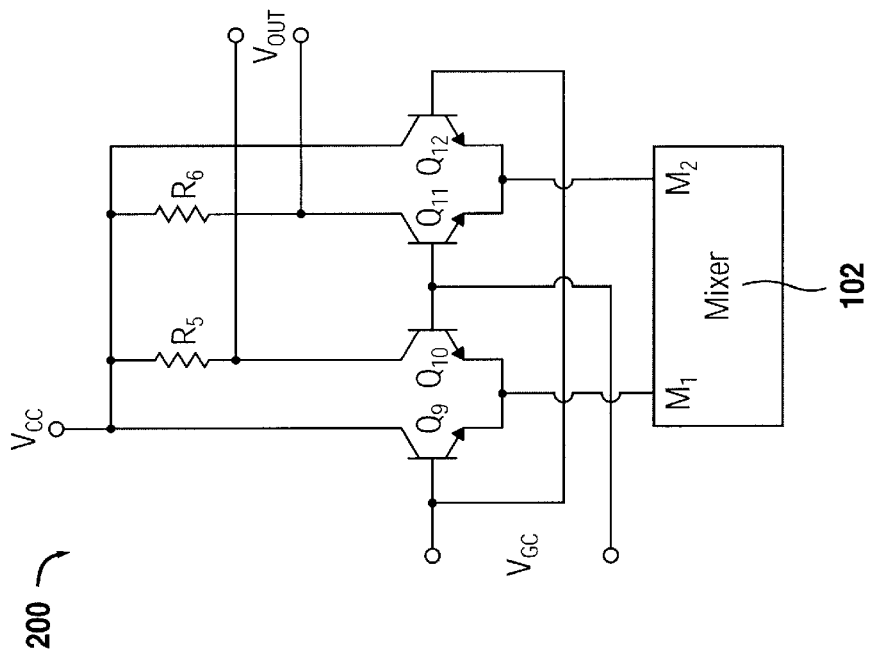
FIG. 3 is a schematic of another traditional coupling of a mixer and a variable gain amplifier.
Figure 2:
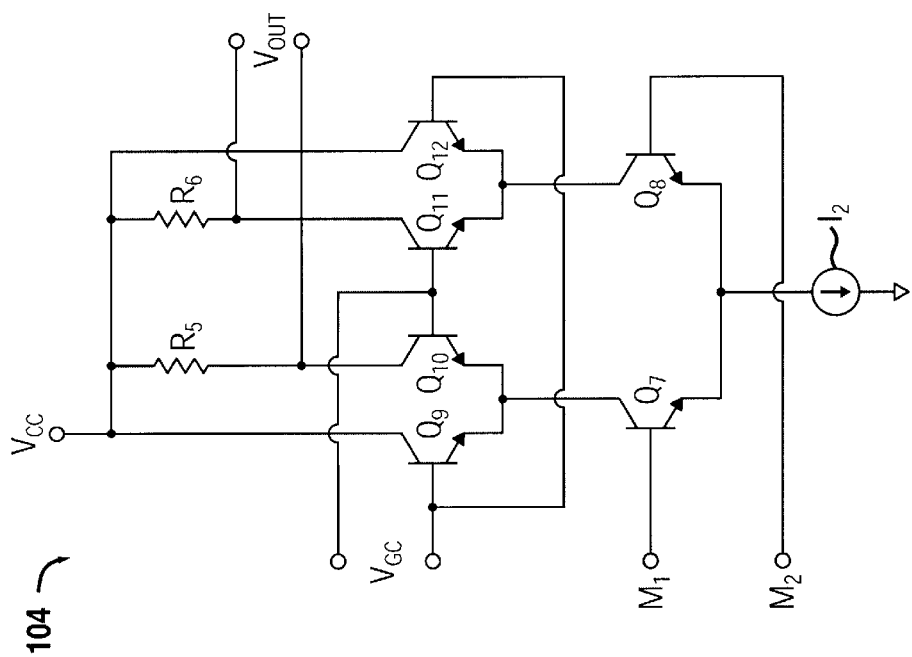
FIG. 2 is a schematic showing the variable gain amplifier of FIG. 1 in more detail.

The merged variable gain mixers of the present invention do place a greater power demand upon the local oscillator circuitry. For example, in Prior Art FIG. 1 the local oscillator circuitry must drive only four (4) transistors, whereas in the embodiments of FIGS. 4 and 5 the local oscillator circuitry must drive eight (8) transistors. This is not believed to be a significant constraint.

Although only a few embodiments of the present invention have been described in detail herein, it should be understood that the present invention may be embodied in many other specific forms without departing from the spirit or scope of the invention.

For example, the symbol utilized to denote transistors in the Figures is generally known to represent bipolar type transistor technology. However, it will be appreciated that field-effect transistors (FETs) such as MOSFETs would work well for the present invention.

As will further be appreciated, the present invention is suitable for use in implementing both up and down converting mixers.

Therefore, the present examples and embodiments are to be considered as illustrative and not restrictive, and the invention is not to be limited to the details given herein, but may be modified within the scope of the appended claims.

I claim:

1. A merged variable gain mixer comprising:
   a switching device having first and second input pairs and an output pair, the switching device responsive to a signal LO applied to the first input pair and an input signal $I_f$ applied to the second input pair to generate an output signal $O_f$ at the output pair, the output signal $O_f$ having an amplitude that is a function of the input signal $I_f$ and an output frequency that is a function of both the signal LO and the input signal $I_f$; and a current steering device having a first input pair, a supply voltage input, and a control voltage input, the current steering device operable to control, as a function of a control voltage $V_{gc}$ applied at the control voltage input, current flowing between a supply voltage $V_{cc}$ coupled to the supply voltage input and the current steering device first input pair, wherein the switching device second input pair and the current steering device first input pair are coupled together such that the current steering device can attenuate the output signal $O_f$ by steering a portion of the current of the input signal $I_f$ away from the switching device and dumping that portion of the current out to the supply voltage $V_{cc}$.

2. A merged variable gain mixer as recited in claim 1, wherein the switching device includes four transistors Q1, Q2, Q3, and Q4, the bases of transistors Q1 and Q2 coupled to a first terminal of the switching device first input pair, the bases of transistors Q3 and Q4 coupled to a second terminal of the switching device first input pair, the emitters of transistors Q1 and Q3 coupled to a first terminal of the switching device second input pair, the emitters of transistors Q2 and Q4 coupled to a second terminal of the switching device second pair, the collectors of transistors Q1 and Q4 coupled to a first terminal of the switching device output pair, and the collectors of transistors Q2 and Q3 coupled to a second terminal of the switching device output pair.

3. A merged variable gain mixer as recited in claim 2 wherein the four transistors Q1, Q2, Q3, and Q4 are bipolar transistors.

4. A merged variable gain mixer as recited in claim 2 wherein the four transistors Q1, Q2, Q3, and Q4 are field-effect transistors.

5. A merged variable gain mixer as recited in claim 2, wherein the current steering device further includes a second input pair coupled to the switching device first input pair.

6. A merged variable gain mixer as recited in claim 2 wherein the current steering device includes four transistors Q5, Q6, Q7, and Q8, the bases of transistors Q5 and Q8 being coupled to the first terminal of the switching device first input pair, the bases of transistors Q5 and Q8 further coupled to the control voltage input through a resistor $R_1$, the base of Q6 coupled to the control voltage input through a resistor $R_2$, the base of Q7 coupled to the control voltage input through a resistor $R_3$, the collectors of transistors Q5, Q6, Q7, and Q8 coupled together at the supply voltage input, the emitters of transistors Q5 and Q6 coupled together at the first terminal of the switching device second input pair, and the emitters of transistors Q7 and Q8 coupled together at the second terminal of the switching device second input pair.

7. A merged variable gain mixer as recited in claim 6 wherein the four transistors Q5, Q6, Q7, and Q8 are bipolar transistors.

8. A merged variable gain mixer as recited in claim 6 wherein the four transistors Q5, Q6, Q7, and Q8 are field-effect transistors.

9. A merged variable gain mixer having a double balanced configuration, the merged variable gain mixer comprising:

a mixing quad having four transistors Q1, Q2, Q3, and Q4, the bases of transistors Q1 and Q2 coupled to a first terminal, the bases of transistors Q3 and Q4 coupled to a second terminal, the emitters of transistors Q1 and Q3 coupled to a third terminal, the emitters of transistors Q2 and Q4 coupled to a fourth terminal, the collectors of transistors Q1 and Q4 coupled to a fifth terminal, and the collectors of transistors Q2 and Q3 coupled to a sixth terminal; and a Gilbert current steering quad having four transistors Q5, Q6, Q7, and Q8, the bases of transistors Q5 and Q8 being coupled to a seventh terminal, the bases of transistors Q5 and Q8 further coupled to a control voltage input through a resistor $R_1$, the base of Q6 coupled to the control voltage input through a resistor $R_2$, the base of Q7 coupled to the control voltage input through a resistor $R_3$, the collectors of transistors Q5, Q6, Q7, and Q8 coupled together at a supply voltage input, the emitters of transistors Q5 and Q6 coupled together at the third terminal, and the emitters of transistors Q7 and Q8 coupled together at the third terminal.

10. A merged variable gain mixer as recited in claim 9 further comprising a first blocking capacitor intended to electrically couple the first terminal to a first local oscillator terminal and a second blocking capacitor intended to electrically couple the second terminal to a second local oscillator terminal.

11. A merged variable gain mixer as recited in claim 10 further comprising a third blocking capacitor intended to electrically couple the seventh terminal to the first local oscillator terminal and a fourth blocking capacitor intended to electrically couple the bases of transistors Q6 and Q7 to the second local oscillator terminal.

12. A merged variable gain mixer as recited in claim 9 wherein the transistors are bipolar transistors.

13. A merged variable gain mixer as recited in claim 9 wherein the transistors are field-effect transistors.

14. A merged variable gain mixer as recited in claim 9 further comprising a bias device capable of providing bias signals at the bases of the transistors Q1, Q2, Q3, and Q4.

15. A merged variable gain mixer as recited in claim 14 wherein the bias device has a bias voltage $V_b$, and a resistor $R_5$ coupling the bias voltage $V_b$ to the bases of transistors Q1 and Q2 and a resistor $R_6$ coupling the bias voltage $V_b$ to the bases of transistors Q3 and Q4.

16. A merged variable gain mixer having a single balanced configuration, the merged variable gain mixer comprising:

a mixing stage having two transistors Q1 and Q2; and a current steering stage having two transistors Q3 and Q4, wherein the mixing stage and the current steering stage are coupled in parallel, the emitters of the transistors Q1, Q2, Q3 and Q4 being coupled together forming a current input terminal, the collectors of Q3 and Q4 being coupled together at a supply voltage input, and the collectors of the transistors Q1 and Q2 forming output terminals, wherein the merged variable gain mixer arranged for use as an AC coupled merged variable gain mixer, the bases of the transistors Q1 and Q2 being provided a DC bias and further coupled to a local oscillator signal through a pair of DC blocking capacitors, the bases of the transistors Q3 and Q4 being provided a DC bias and a control signal suitable for controlling the gain of the variable gain mixer.

17. A merged variable gain mixer as recited in claim 16 wherein the transistors Q1, Q2, Q3 and Q4 are bipolar transistors.

18. A merged variable gain mixer as recited in claim 16 wherein the transistors Q1, Q2, Q3, and Q4 are field-effect transistors.

19. A merged variable gain mixer having a single balanced configuration, the merged variable gain mixer comprising:

a mixing stage having two transistors Q1 and Q2; and a current steering stage having two transistors Q3 and Q4, wherein the mixing stage and the current steering stage are coupled in parallel, the emitters of the transistors Q1, Q2, Q3 and Q4 being coupled together forming a current input terminal, the collectors of Q3 and Q4 being coupled together at a supply voltage input, and the collectors of the transistors Q1 and Q2 forming output termninals, wherein the merged variable gain mixer arranged for use as a DC coupled merged variable gain mixer switched by a local oscillator signal LO composed of differential parts LO1 and LO2, the local oscillator signal LO including DC bias and a gain control signal, the bases of Q1 and Q2 being differentially coupled to LO1 and the bases of the transistors Q3 and Q4 being differentially coupled to LO2.

20. A method for mixing a variably amplifying an input signal $I_f$ in order to generate an output signal $O_f$, the method comprising the acts of:

receiving an input signal $I_f$ having an input frequency and an input current;

receiving a local oscillator signal;

receiving a gain control voltage $V_{gc}$;

absorbing a portion of the input current as a function of the gain control voltage $V_{gc}$ and the local oscillator signal, thereby generating an attenuated input signal having an attenuated input current; and generating an output signal $O_f$ that is a function of the attenuated input signal, the input frequency, and the local oscillator signal, wherein the control voltage $V_{gc}$ can be selected such that the attenuated input current is substantially equivalent to the input current.

21. A method for mixing a variably amplifying an input signal $I_f$ in order to generate an output signal $O_f$, the method comprising the acts of:

receiving an input signal $I_f$ having an input frequency and an input current;

receiving a local oscillator signal;

receiving a gain control voltage $V_{gc}$;

absorbing a portion of the input current as a function of the gain control voltage $V_{gc}$ and the local oscillator signal, thereby generating an attenuated input signal having an attenuated input current; and generating an output signal $O_f$ that is a function of the attenuated input signal, the input frequency, and the local oscillator signal, wherein the act of generating an output signal $O_f$ includes amplifying the attenuated input current by a constant value.

22. A method as recited in claim 21 wherein the constant value is unity.

23. A method as recited in claim 21 wherein the constant value is greater than unity.

* * * * *